United States Patent
Zhang et al.

(10) Patent No.: US 11,670,045 B2
(45) Date of Patent: Jun. 6, 2023

(54) METHOD AND APPARATUS FOR CONSTRUCTING A 3D GEOMETRY

(71) Applicant: TENCENT AMERICA LLC, Palo Alto, CA (US)

(72) Inventors: Xiang Zhang, Sunnyvale, CA (US); Bing Jian, Cupertino, CA (US); Lu He, Palo Alto, CA (US); Haichao Zhu, Los Angeles, CA (US); Shan Liu, San Jose, CA (US); Kelin Liu, Thornhill (CA); Weiwei Feng, Mountain View, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 0 days.

(21) Appl. No.: 17/502,973

(22) Filed: Oct. 15, 2021

(65) Prior Publication Data
US 2022/0358716 A1 Nov. 10, 2022

Related U.S. Application Data

(60) Provisional application No. 63/185,946, filed on May 7, 2021.

(51) Int. Cl.
*G06T 17/00* (2006.01)
*G06T 7/73* (2017.01)
(Continued)

(52) U.S. Cl.
CPC ............... *G06T 17/00* (2013.01); *G06T 7/50* (2017.01); *G06T 7/60* (2013.01); *G06T 7/73* (2017.01);
(Continued)

(58) Field of Classification Search
None
See application file for complete search history.

(56) References Cited

U.S. PATENT DOCUMENTS 9,554,064 B2 * 1/2017 Dixon .................... H04N 5/332
10,937,247 B1 * 3/2021 Chuah ...................... G06T 7/60
(Continued)

OTHER PUBLICATIONS

Farin et al.; "Floor-plan reconstruction from panoramic images;" MM '07: Proceedings of the 15th ACM international conference on Multimedia; Sep. 2007, pp. 823-826 (Year: 2007).*

(Continued)

*Primary Examiner* — Edward Martello
(74) *Attorney, Agent, or Firm* — ArentFox Schiff LLP (57) ABSTRACT

Aspects of the disclosure include methods, apparatuses, and non-transitory computer-readable storage mediums for generating a three-dimensional (3D) geometry of a room from a panorama image of the room. An apparatus includes processing circuitry that determine two-dimensional (2D) positions of wall corner points of the room in the panorama image based on a user input. Each wall corner point is in one of a floor plane or a ceiling plane of the room. The processing circuitry calculates 3D positions of the wall corner points based on the 2D positions of the wall corner points, a size of the panorama image, and a distance between the floor plane and a capture position of a device capturing the panorama image, determines a room layout based on an order of the wall corner points, and generates the 3D geometry based on the room layout and the 3D positions of the wall corner points.

20 Claims, 7 Drawing Sheets

(51) Int. Cl.
  *G06T 7/60* (2017.01)
  *G06T 7/50* (2017.01)
  *G06T 7/90* (2017.01)

(52) U.S. Cl.
  CPC ............ *G06T 7/90* (2017.01); *G06T 2200/24* (2013.01); *G06T 2207/20164* (2013.01)

(56) References Cited

U.S. PATENT DOCUMENTS

| | | | | |
|---|---|---|---|---|
| 11,263,457 | B2* | 3/2022 | Rom | G06F 3/04815 |
| 2002/0093538 | A1* | 7/2002 | Carlin | G06Q 30/02 |
| | | | | 715/778 |
| 2007/0130239 | A1 | 6/2007 | Wheeler et al. | |
| 2010/0194768 | A1 | 8/2010 | Schrag | |
| 2011/0123115 | A1 | 5/2011 | Lee et al. | |
| 2014/0132633 | A1* | 5/2014 | Fekete | G06Q 50/01 |
| | | | | 345/634 |
| 2015/0331970 | A1* | 11/2015 | Jovanovic | G06T 15/10 |
| | | | | 703/1 |
| 2018/0067593 | A1 | 3/2018 | Tiwari et al. | |
| 2018/0102858 | A1 | 4/2018 | Tiwari et al. | |
| 2018/0374276 | A1* | 12/2018 | Powers | G06T 17/205 |
| 2019/0033989 | A1* | 1/2019 | Wang | H04N 13/271 |
| 2020/0218074 | A1* | 7/2020 | Hoover | G06T 19/006 |
| 2020/0302681 | A1* | 9/2020 | Totty | G06T 7/74 |
| 2020/0413095 | A1 | 12/2020 | Choi et al. | |
| 2021/0082189 | A1* | 3/2021 | Jovanovic | G06T 19/006 |

OTHER PUBLICATIONS

Fernandez-Labrador et al.; "Layouts From Panoramic Images With Geometry and Deep Learning;" IEEE Robotics and Automation Letters, vol. 3, No. 4, pp. 3153-3160, Oct. 2018 (Year: 2018).*

International Search Report and Written Opinion dated Jan. 26, 2022 in International Patent Application No. PCT/US2021/055393. 12 pages.

Fernandez-Labrador et al. "Layouts from Panoramic Images with Geometry and Deep Learning", arXiv:1806.08294v1 [cs.CV] Jun. 21, 2018. Retrieved on Dec. 18, 2021. Retrieved from <URL: https://arxiv.org/pdf/1806.08294.pdf> entire document.

Cheng Sun et al., "HorizonNet: Learning Room Layout with 1D Representation and Pano Stretch Data Augmentation", arXiv:1901. 03861v2 [cs.CV], Apr. 6, 2019 (18 pages).

Chuhang Zou et al., "LayoutNet: Reconstructing the 3D Room Layout from a Single RGB Image", arXiv:1803.08999v1 [cs.CV], Mar. 23, 2018 (16 pages).

Chuhang Zou et al., "Manhattan Room Layout Reconstruction from a Single 360° image: A Comparative Study of State-of-the-art Methods", arXiv:1910.04099v3 [cs.CV], Dec. 25, 2020 (20 pages).

Giovanni Pintore et al., "Automatic 3D Reconstruction of Structured Indoor Environments", In: ACM SIGGRAPH Courses, Los Angeles, Aug. 17, 2020-Aug. 28, 2020, DOI: https://doi.org/10. 1145/3388769.3407469, 2020 (20 pages).

Shang-Ta Yang et al., "DuLa-Net: A Dual-Projection Network for Estimating Room Layouts from a Single RGB Panorama", arXiv:1811. 11977v2 [cs.CV] Apr. 2, 2019 (14 pages).

* cited by examiner

METHOD AND APPARATUS FOR CONSTRUCTING A 3D GEOMETRY

INCORPORATION BY REFERENCE

This present application claims the benefit of priority to U.S. Provisional Application No. 63/185,946, "METHODS OF CONSTRUCTING 3D GEOMETRY FROM PANORAMA IMAGES WITH MARKED CORNERS FOR INDOOR SCENES," filed on May 7, 2021, which is incorporated by reference herein in its entirety.

TECHNICAL FIELD

The present disclosure describes embodiments generally related to reconstruction of a three-dimensional space, including for various virtual reality and/or augmented reality applications.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A three-dimensional (3D) reconstruction of an indoor building is an active research topic and has been used in various industries including real estate, building construction, building restoration, entertainment, and the like. The 3D reconstruction can leverage technologies such as computer vision and machine learning by taking a single image (e.g., RGB image) or a group of images from different views as an input to generate a 3D geometry representation of the building in a scene. Advances in depth sensors have enabled even more convenient and more accurate ways of measuring depth information from the scene directly. For example, some widely used depth cameras include Lidar, structured light, and the like.

SUMMARY

Aspects of the disclosure provide apparatuses for generating a three-dimensional (3D) geometry of a room from a panorama image of the room. An apparatus includes processing circuitry that determines two-dimensional (2D) positions of wall corner points of the room in the panorama image of the room based on a user input. Each of the wall corner points is in one of a floor plane or a ceiling plane of the room. The processing circuitry calculates 3D positions of the wall corner points based on the 2D positions of the wall corner points, a size of the panorama image, and a distance between the floor plane of the room and a capture position of a device configured to capture the panorama image of the room. The processing circuitry determines a layout of the room based on an order of the wall corner points. The processing circuitry generates the 3D geometry of the room based on the layout of the room and the 3D positions of the wall corner points.

In an embodiment, the user input includes a user selection of the wall corner points of the room and the order of the wall corner points.

In an embodiment, at least one of the wall corner points is a first type of wall corner point. The first type of wall corner point indicates a wall plane of the 3D geometry.

In an embodiment, at least one of the wall corner points is a second type of wall corner point. The second type of wall corner point indicates an open area plane of the 3D geometry.

In an embodiment, the processing circuitry generates a plane of the 3D geometry based on a type of a predetermined one of two adjacent wall corner points.

In an embodiment, the processing circuitry determines, for each 3D position in a plane of the 3D geometry, color information of the respective 3D position based on color information at a 2D position in the panorama image of the room corresponding to the respective 3D position.

In an embodiment, each wall plane of the 3D geometry is parallel or orthogonal to at least one other wall plane of the 3D geometry and the processing circuitry generates a guide line that assists a user to select one of the wall corner points.

In an embodiment, each wall plane of the 3D geometry is parallel or orthogonal to at least one other wall plane of the 3D geometry and the processing circuitry adjusts one of the wall corner points that is selected by the user.

In an embodiment, the processing circuitry determines 2D positions of two points in the panorama image of the room. The processing circuitry calculates 3D positions of the two points based on the 2D positions of the two points, the size of the panorama image, and the distance between the floor plane of the room and the capture position of the device. The processing circuitry calculates a distance between the 3D positions of the two points.

Aspects of the disclosure provide methods for generating a 3D geometry of a room from a panorama image of the room. The methods can perform any one or a combination of the processes performed by the apparatuses for generating the 3D geometry of the room from the panorama image of the room. In a method, 2D positions of wall corner points of the room in the panorama image of the room are determined based on a user input. Each of the wall corner points is in one of a floor plane or a ceiling plane of the room. 3D positions of the wall corner points are calculated based on the 2D positions of the wall corner points, a size of the panorama image, and a distance between the floor plane of the room and a capture position of a device configured to capture the panorama image of the room. A layout of the room is generated based on an order of the wall corner points. The 3D geometry of the room is generated based on the layout of the room and the 3D positions of the wall corner points.

Aspects of the disclosure also provide non-transitory computer-readable mediums storing instructions which when executed by at least one processor cause the at least one processor to perform any one or a combination of the methods for generating a three-dimensional (3D) geometry of a room from a panorama image of the room.

BRIEF DESCRIPTION OF THE DRAWINGS

Further features, the nature, and various advantages of the disclosed subject matter will be more apparent from the following detailed description and the accompanying drawings in which.

DETAILED DESCRIPTION OF EMBODIMENTS

I. A Three-Dimensional Geometry Construction

This disclosure is related to reconstruction of a three-dimensional (3D) space, such as a room. The room can be in a building for example. Further, the 3D reconstruction can be used in various virtual reality (VR) and/or augmented reality (AR) applications such as virtual tours, a digital museum, and a virtual home sale. In this disclosure, methods of constructing a 3D geometry of a room from panorama image(s) with handcrafted corners for indoor scenes is described as an example. However, it should be understood that the method can be applied to other 3D spaces.

A 3D geometry representation of an object is usually in the form of a point cloud, which contains a set of 3D points in space. Each 3D point can include 3D position information and additional attributes such as color information and reflectance information. Another popular 3D format is a textured mesh, which contains connectivity information between neighboring points, in addition to 3D point information. Based on the connectivity information, a collection of facets (e.g., triangles) of the textured mesh can be formed. Texture information of the textured mesh can be also attached to each facet.

In some indoor scene applications, by taking advantages of some prior knowledge, some learning based methods (e.g., LayoutNet algorithm, HorizonNet algorithm, and Dula-Net algorithm) can be used to predict some room layout elements such as layout boundaries and corner positions from a single panorama image of a room. However, these algorithms are typically data driven and require high quality training data. The algorithms may fail in production scenarios because of the complexity of real world scenes.

This disclosure includes methods of reconstructing a 3D geometry of a room from a single panorama image of the room with hand-marked (e.g., manually marked by a user), wall corners of the room in the panorama image. It is noted that these methods can be applied in a semi-automatic pipeline. For example, an automatic algorithm (e.g., LayoutNet algorithm, HorizonNet algorithm, or Dula-Net algorithm) can be first used to generate a rough estimation of the layout corners, and then the methods of this disclosure can be used to refine the layout corners. In another example, the layout corners can be hand-marked by using the methods of this disclosure, and then an automatic refinement algorithm can be applied to the hand-marked corners.

Figure 1A:
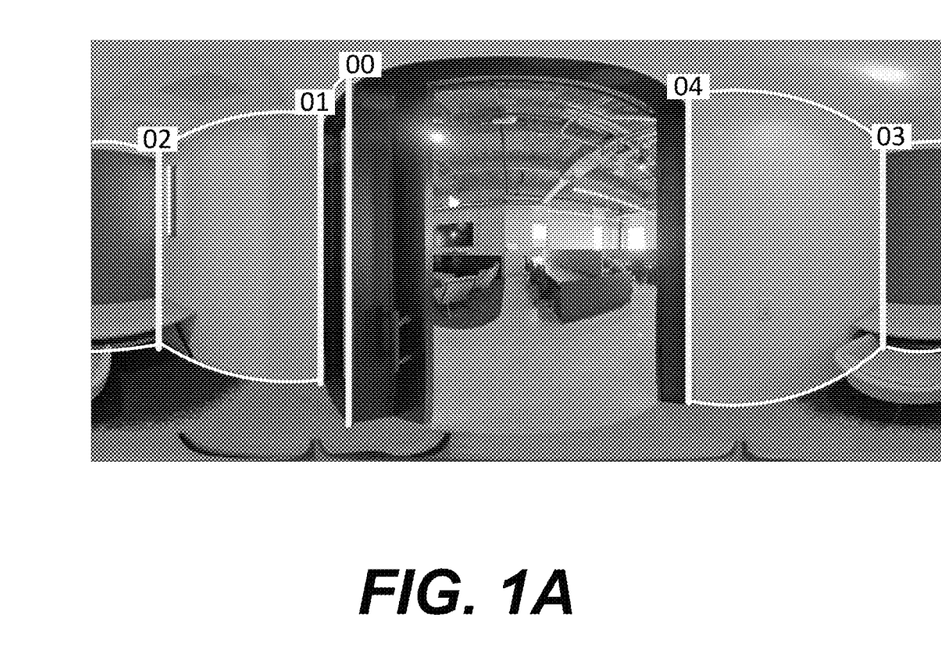
FIG. 1A shows an exemplary panorama image of a room according to an embodiment of the disclosure.
Figure 1B:
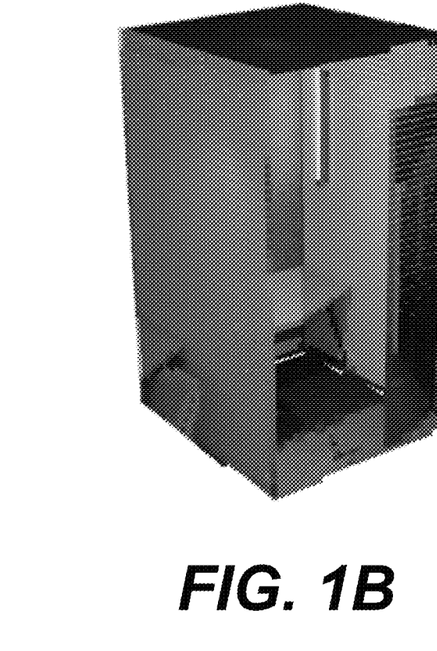
FIG. 1B shows an exemplary 3D geometry of the room according to an embodiment of the disclosure.

FIG. 1A shows an exemplary panorama image of a room according to an embodiment of the disclosure. In the panorama image, a user can mark one or more wall corners of the room manually. Based on the marked wall corners, a 3D geometry of the room can be generated, as shown in FIG. 1B. The 3D geometry of the room can be represented in the form of a point cloud or a textured mesh.

In methods of this disclosure, a panorama image (I) of a room can be used as an input. It is assumed that a size of the panorama image (I) is W×H, where W=2H in pixels. In addition, an accurate value of a camera height (e.g., a vertical distance between a center position of a camera to the ground plane) can be provided. The camera height can be provided by a user, estimated by algorithms, measured, or set as a default value (e.g., 1.5 meters). The camera height is denoted as $H_{cam}$.

In methods of this disclosure, certain assumptions can be made regarding surfaces of the 3D space. For example, it can be assumed that floors of the room are flat and horizontal to the ground plane. Ceilings of the room can be assumed to be flat and horizontal to the ground plane. Walls of the room can be assumed to be vertical, and thus perpendicular to the floors. Further, a camera ray can be assumed to be parallel to the ground plane.

In methods of this disclosure, in a camera coordinate system, the center position of the camera can be used as an origin of the world coordinates in Cartesian coordinate system, i.e., a coordinate of the camera is (0, 0, 0). It can also be assumed that the camera faces towards the positive x axis, the negative z axis is towards the floor plane, and the floor plane and ceiling plane are parallel to the x-y plane. The horizontal vanishing line of the ground plane is at the middle height of the panorama image of the room. Therefore, the z-axis position of the floor plane is $-H_{cam}$.

With the above assumptions, a coordinate of a 3D position in the room can be converted between an image coordinate of a pixel in the panorama image corresponding to the 3D position and a Cartesian coordinate of the 3D position in a camera coordinate system. It is noted that the conversion equations can vary if the assumptions are different.

According to aspects of the disclosure, an image coordinate of a pixel in the panorama image can be converted to a Cartesian coordinate of a 3D position in the camera coordinate system corresponding to the pixel.

In an embodiment, the image coordinate of the pixel in the panorama image is (u, v), where $u \in [0,W), v \in [0,H]$. It is assumed that the z-axis coordinate of the corresponding 3D position in the camera coordinate system is known. Thus, the image coordinate of the pixel can be converted to the Cartesian coordinate of the corresponding 3D position as follows:

$$x = z \cdot \tan\left(v \cdot \frac{\pi}{H}\right) \cdot \sin\left(u \cdot \frac{2\pi}{W}\right) \quad \text{(Eq. 1)}$$

$$y = z \cdot \tan\left(v \cdot \frac{\pi}{H}\right) \cdot \cos\left(u \cdot \frac{2\pi}{W}\right) \quad \text{(Eq. 2)}$$

Then, a distance between the corresponding 3D position and the camera in the real world can be estimated by $\sqrt{x^2+y^2}$.

Therefore, if the pixel is on the floor plane, the Cartesian coordinate of the corresponding 3D position in the camera coordinate system can be expressed as follows:

$$x = -H_{cam} \cdot \tan\left(v \cdot \frac{\pi}{H}\right) \cdot \sin\left(u \cdot \frac{2\pi}{W}\right) \quad \text{(Eq. 3)}$$

$$y = -H_{cam} \cdot \tan\left(v \cdot \frac{\pi}{H}\right) \cdot \cos\left(u \cdot \frac{2\pi}{W}\right) \quad \text{(Eq. 4)}$$

$$z = -H_{cam} \quad \text{(Eq. 5)}$$

If the pixel is on the ceiling plane and the ceiling height, i.e., a vertical distance from the ceiling plane to the floor plane, is known as $H_{ceil}$, the Cartesian coordinate of the corresponding 3D position in the camera coordinate system can be expressed as follows:

$$x = (H_{ceil} - H_{cam}) \cdot \tan\left(v \cdot \frac{\pi}{H}\right) \cdot \sin\left(u \cdot \frac{2\pi}{W}\right) \quad \text{(Eq. 6)}$$

$$y = (H_{ceil} - H_{cam}) \cdot \tan\left(v \cdot \frac{\pi}{H}\right) \cdot \sin\left(u \cdot \frac{2\pi}{W}\right) \quad \text{(Eq. 7)}$$

$$z = H_{ceil} - H_{cam} \quad \text{(Eq. 8)}$$

According to aspects of the disclosure, a Cartesian coordinate of a 3D position in the camera coordinate system can be converted to an image coordinate of a pixel in the panorama image corresponding to the 3D position.

When the Cartesian coordinate of the 3D position in the camera coordinate system is (x,y,z), the image coordinate of the corresponding pixel in the panorama image can be expressed as follows:

$$u = \text{arctan2}(y, x) \cdot \frac{W}{2\pi} \quad \text{(Eq. 9)}$$

$$v = \text{arctan2}(y, \sin(\text{arctan2}(y, x)) \cdot z) \cdot \frac{H}{\pi} \quad \text{(Eq. 10)}$$

where arctan 2( ) is a function defined as follows, $$\text{arctan2}(y, x) = \begin{cases} 2 \cdot \arctan\left(\frac{y}{x + \sqrt{x^2 + y^2}}\right) & \text{if } x > 0 \text{ or } y \neq 0 \\ \pi & \text{if } x < 0 \text{ and } y = 0 \\ \text{undefined} & \text{if } x = 0 \text{ and } y = 0 \end{cases} \quad \text{(Eq. 11)}$$

According to aspects of the disclosure, a height of an object in the room can be estimated based on the panorama image of the room. Given two pixels at the same column in the panorama image, coordinates of the two pixels in the panorama image are denoted as $(u,v_1)$ and $(u,v_2)$, and the z-axis coordinate of a first 3D position in the camera coordinate system corresponding to one pixel in $(u,v_1)$ is known and is equal to $z_1$, the z-axis coordinate of a second 3D position in camera coordinate system corresponding to the other pixel in $(u,v_2)$ can be expressed as follows:

$$z_2 = z_1 \cdot \tan\left(v_1 \cdot \frac{\pi}{H}\right) / \tan\left(v_2 \cdot \frac{\pi}{H}\right) \quad \text{(Eq. 12)}$$

One exemplary application is to estimate a height of a point of interest in an object to the floor plane in the panorama image. If the pixel in $(u,v_1)$ is known to be on the floor plane, i.e., $z_1 = -H_{cam}$, then the z-axis coordinate of the second 3D position in the camera coordinate system corresponding to the other pixel in $(u,v_2)$ can be expressed as follows:

$$z_2 = -H_{cam} \cdot \tan\left(v_1 \cdot \frac{\pi}{H}\right) / \tan\left(v_2 \cdot \frac{\pi}{H}\right) \quad \text{(Eq. 13)}$$

If the point of interest in the object is the pixel in $(u,v_2)$, then the height of the point of interest in the object to the floor plane is $H_{obj} = z_2 - z_1$.

Figure 2:
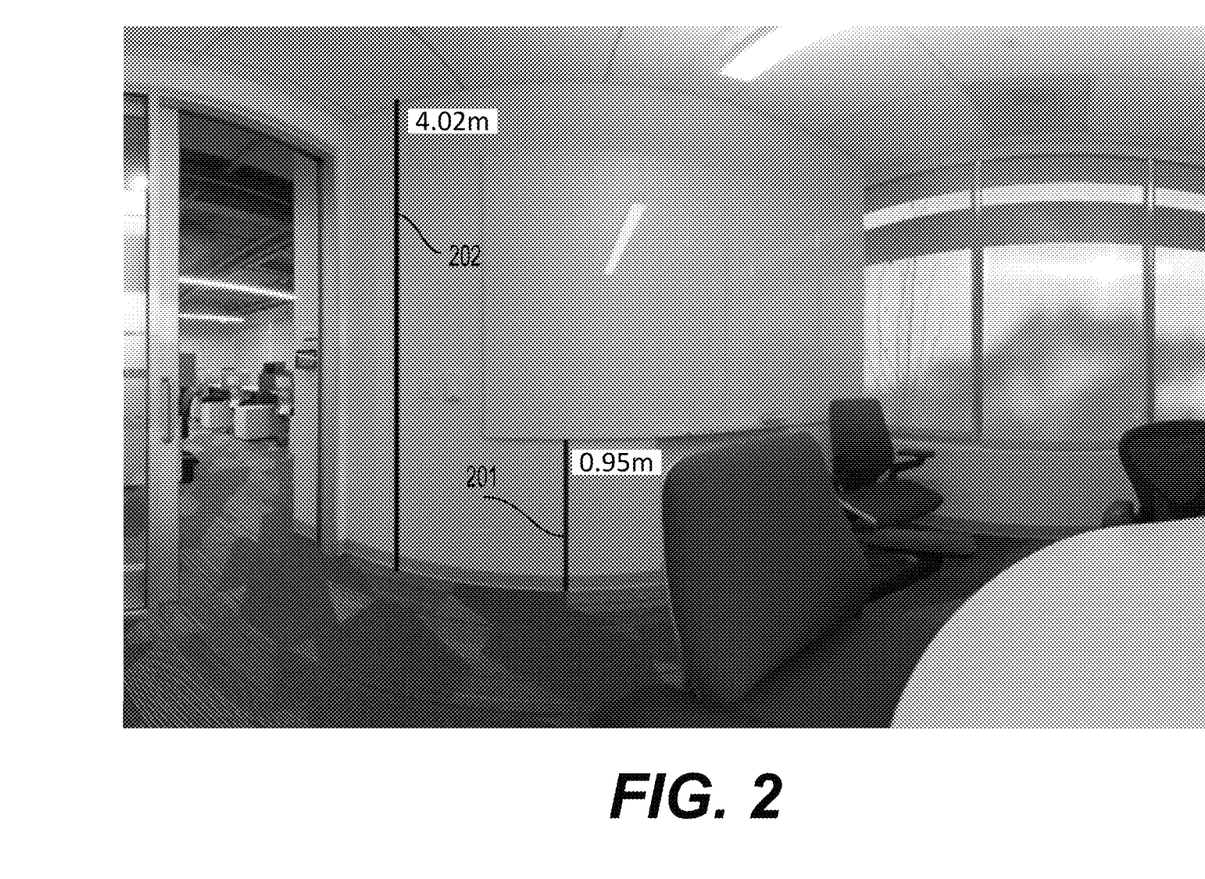
FIG. 2 shows an example of measuring a height of a white board in a panorama image of another room according to an embodiment of the disclosure.

FIG. 2 shows an example of measuring a height of a white board in a panorama image of a room according to an embodiment of the disclosure. It is noted that FIG. 2 illustrates a part of the panorama image of the room. In FIG. 2, a vertical line (201) is manually drawn from a floor plane of the room to a bottom side of the white board, so the height of the white board can be estimated automatically. Through this way, an object height such as a ceiling height or a desk height can be estimated too. For example, a vertical line (202) shows the ceiling height of the room.

It is noted that the ceiling height of the room can also be set by a user in some embodiments. Thus, once the ceiling height, i.e., $H_{ceil}$, is determined, a point in a floor plane (or in a ceiling plane) can be determined automatically based on a corresponding point in the ceiling plane (or in the floor plane) if the corresponding point is marked by a user. Both points are in the same vertical line or column in the panorama image of the room.

In an embodiment, if the ceiling height is determined and the point in the floor plane of the room is determined (e.g., marked by a user), the corresponding point in the ceiling plane of the room can be determined automatically. Both points are in the same vertical line in the panorama image of the room.

For example, if a point $(u_1,v_1)$ in a panorama image of a room is in a floor plane of the room, a Cartesian coordinate of the point in the camera coordinate system, i.e., $(x_1,y_1,z_1)$ can be calculated by (Eq. 1)-(Eq. 2), where $z_1 = -H_{cam}$. Then, a Cartesian coordinate of a corresponding point in a ceiling plane of the room can be calculated as $(x_2,y_2,z_2) = (x_1,y_1,z_1 + H_{ceil})$. Then, an image coordinate of a pixel corresponding to the point in the ceiling plane can be calculated by (Eq. 9)-(Eq. 10).

In an embodiment, if the ceiling height is determined and the point in the ceiling plane of the room is determined (e.g., marked by a user), the corresponding point in the floor plane of the room can be determined automatically. Both points are in the same vertical line in the panorama image of the room.

For example, if the point $(u_1,v_1)$ in the panorama image of the room is in the ceiling plane, the Cartesian coordinate of the point in the camera coordinate system, i.e., $(x_1,y_1,z_1)$ can be calculated by (Eq. 1)-(Eq. 2), where $z_1 = H_{ceil} - H_{cam}$. Then, the Cartesian coordinate of the corresponding point in the floor plane can be calculated as $(x_2,y_2,z_2) = (x_1,y_1,z_1 - H_{ceil})$. Then, the image coordinate of the point in the floor plane can be calculated by (Eq. 9)-(Eq. 10).

The above methods can be important because in real scenes it is common that either the point in the floor plane or the point in the ceiling plane point is obstructed by an object. In this case, a user can click on a visible point in either the floor plane or the ceiling plane, and the occluded counterpart can be estimated automatically in the panorama image. That is, a corner of a wall can be determined if at least one of the point in the floor plane or the point in the ceiling plane point is manually marked.

Figure 3:
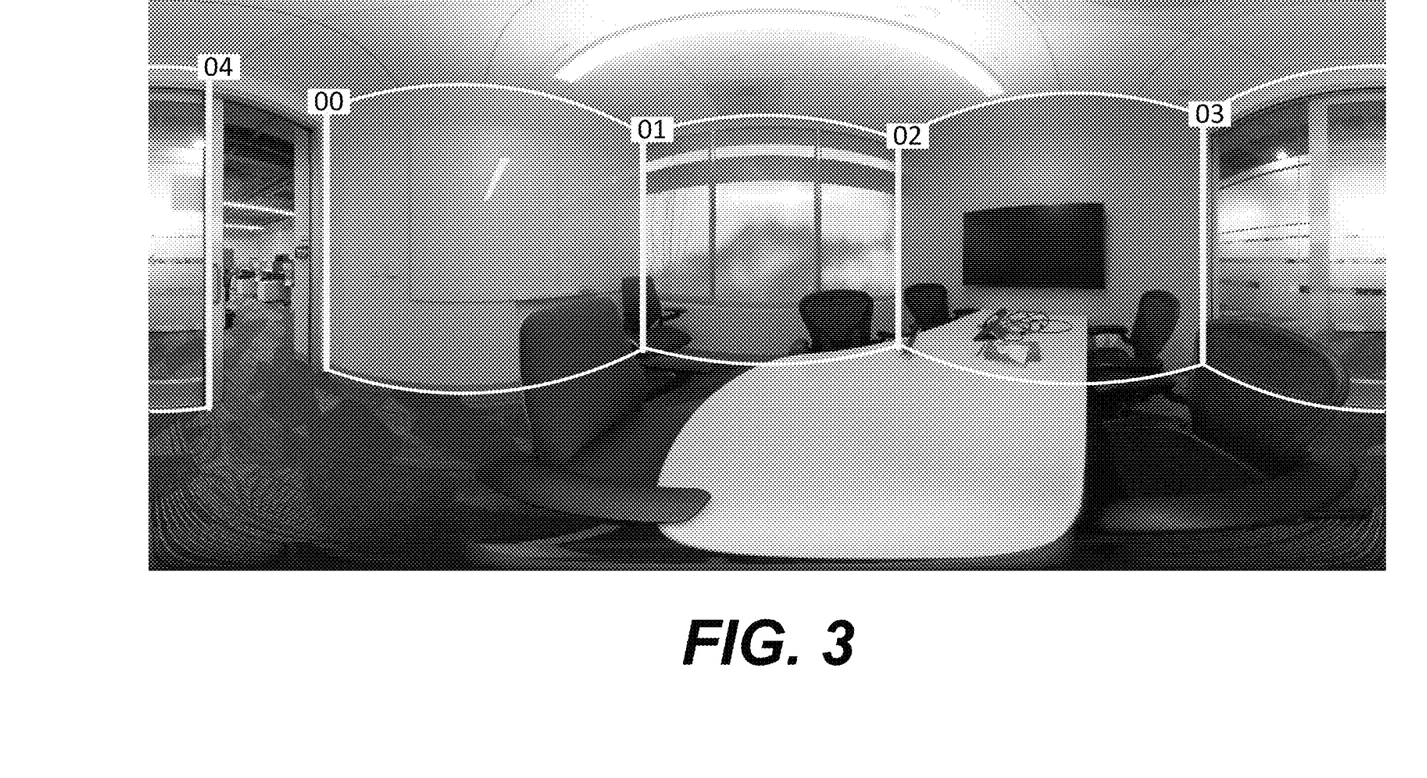
FIG. 3 shows an example of determining an obstructed point in the panorama image of the other room according to an embodiment of the disclosure.

FIG. 3 shows an example of determining an obstructed point in a panorama image of a room. For example, for corner point pairs marked with number "01", "02" and "03", the corner points in a floor plane of the room are obstructed by some chairs and a desk in the room. However, these corner points can still be estimated by clicking the corresponding points in a ceiling plane of the room.

A pair of ceiling and floor corner points that are in the same vertical line of a panorama image of a room can define a vertical straight line in a 3D space. Two pairs of corner points can define a vertical wall plane in the 3D space. For example, in FIG. 3, the corner point pairs "00" and "01" define a wall plane with the white board, the corner point pairs "01" and "02" define a wall plane with the window, the corner point pairs "02" and "03" define a wall plane with the TV, and the corner point pairs "03" and "04" define a wall plane with the glass door. It is noted that the corner point pairs "04" and "00" define an opened door instead of a solid wall plane.

According to aspects of the disclosure, a room layout can be defined by control points. The room layout can be a polygon shape area and include multiple corner points. Some adjacent corner points can form a wall plane, while others can form an opening area. Thus, a closure concept and two types of control points can be described as follows.

Figure 4A:
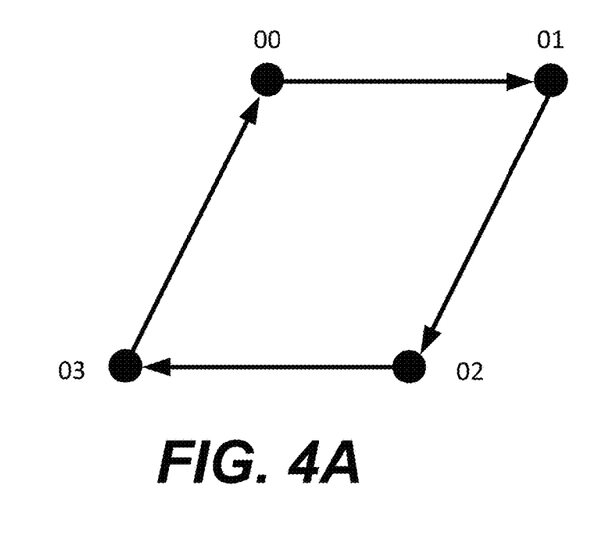
FIGS. 4A-4D show various examples of room layouts defined by closures and control points according to some embodiments of the disclosure.

A closure can be defined as a set of control points with a certain order. In FIG. 3, the corner point pairs from "00" to "04" form a closure. FIG. 4A shows another example of a closure according to an embodiment of the disclosure. In FIG. 4A, control points from "00" to "03" form a closure. It is noted that the control points in FIG. 4 are illustrated in two-dimensional (2D) with a bird-eye view of the x-y plane in the camera coordinate system. A control point in FIG. 4A corresponds to a corner point pair (e.g., one corner point is in a ceiling plane and the other corner point is in a floor plane) in real scenes. Since these two corner points have the same x and y coordinates in the camera coordinate system, they are represented by the same control point in FIG. 4A. To determine a 2D position of a control point, a user can mark a corresponding corner point in either the floor plane or the ceiling plane in the panorama image of the room. It is noted that a closure is a loop and determined based on an order of control points. One control point is connected with its neighbors according to the order, and the last control point is connected with the first control point. For example, "00" and "04" are connected in the closure in FIG. 3.

Figure 4B:
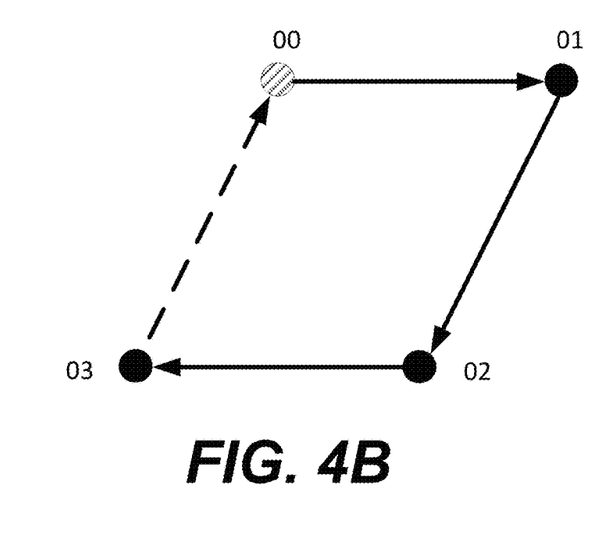
Figure 4C:
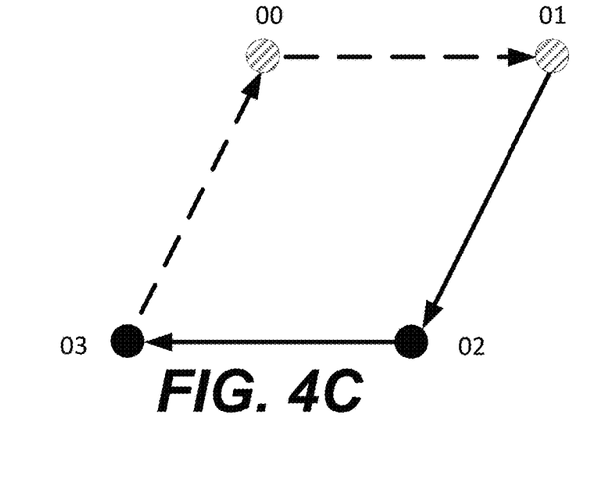
Figure 4D:
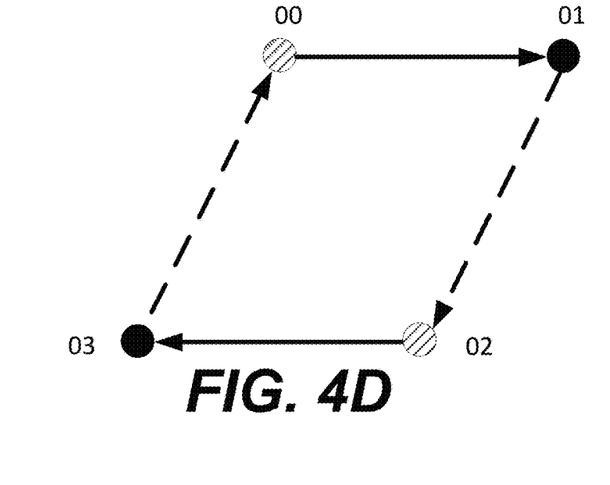

In some embodiments, different types of wall planes can be distinguished using different types of control points. For example, to distinguish between a solid wall plane and an opening area, two types of control points can be defined. As shown in FIGS. 4A-4D, two types of control points can be represented by solid and patterned circles, respectively. A solid control point can form a solid wall plane with its previous control point, while a patterned control point can form an opening area with its previous control point. For example, all four control points in FIG. 4A are solid control points, thus this closure has four solid walls in a space. In FIG. 4B, however, "00" is a patterned control point, thus a segment from "04" to "00" indicates an opening area (e.g., an opened door or window). In FIG. 4C and FIG. 4D, there are two patterned control points and two solid control points, and thus there are two solid walls and two opening areas (e.g., a balcony and a corridor).

It is noted that a closure is not limited to construction of a solid wall plane based on solid control points, but can also construct a floor plane and/or a ceiling plane. A polygon defined by all control points can identify a shape of the floor plane and/or the ceiling plane. Thus, patterned control points can be as important as solid control points.

In one embodiment, a computer software (or program) can distinguish between the two types of control points by different input types, such as a left click or a right click of a computer mouse.

In one embodiment, the computer software (or program) can distinguish the two types of control points with the aid of a keyboard, such as different keyboard inputs.

In some embodiments, more than one closure can be used to describe a room layout of the scene in a single panorama image. The multiple closures are independent from each other and can have different ceiling heights. Therefore, the multiple closures can be used to represent a scene of multiple rooms with different ceiling heights.

Once the room layout is defined by the closure(s) and the control points, the 3D geometry of the scene can be recovered by constructing the wall planes, the floor plane(s), and the ceiling plane(s). The 3D geometry positions of the control points can be calculated based on (Eq. 1)-(Eq. 8). Then, 3D positions in each plane (e.g., a wall plane, a ceiling plane, a floor plane, or another plane) can be calculated by interpolation from the control points. The image coordinate of each interpolated position can be calculated based on (Eq. 9)-(Eq. 10), and color information at the image coordinate of each interpolated position in the panorama image can be applied as color information at the respective interpolated position in the 3D geometry. Thus, a colored point cloud or a textured mesh of the scene can be constructed.

In some embodiments, certain assumptions regarding the arrangement of the walls can be made. For example, Manhattan world assumption can be used in generating a 3D geometry of a 3D space to improve the quality of the generated 3D geometry. In the Manhattan world assumption, it is assumed that the walls are either parallel or orthogonal to each other.

Figure 5:
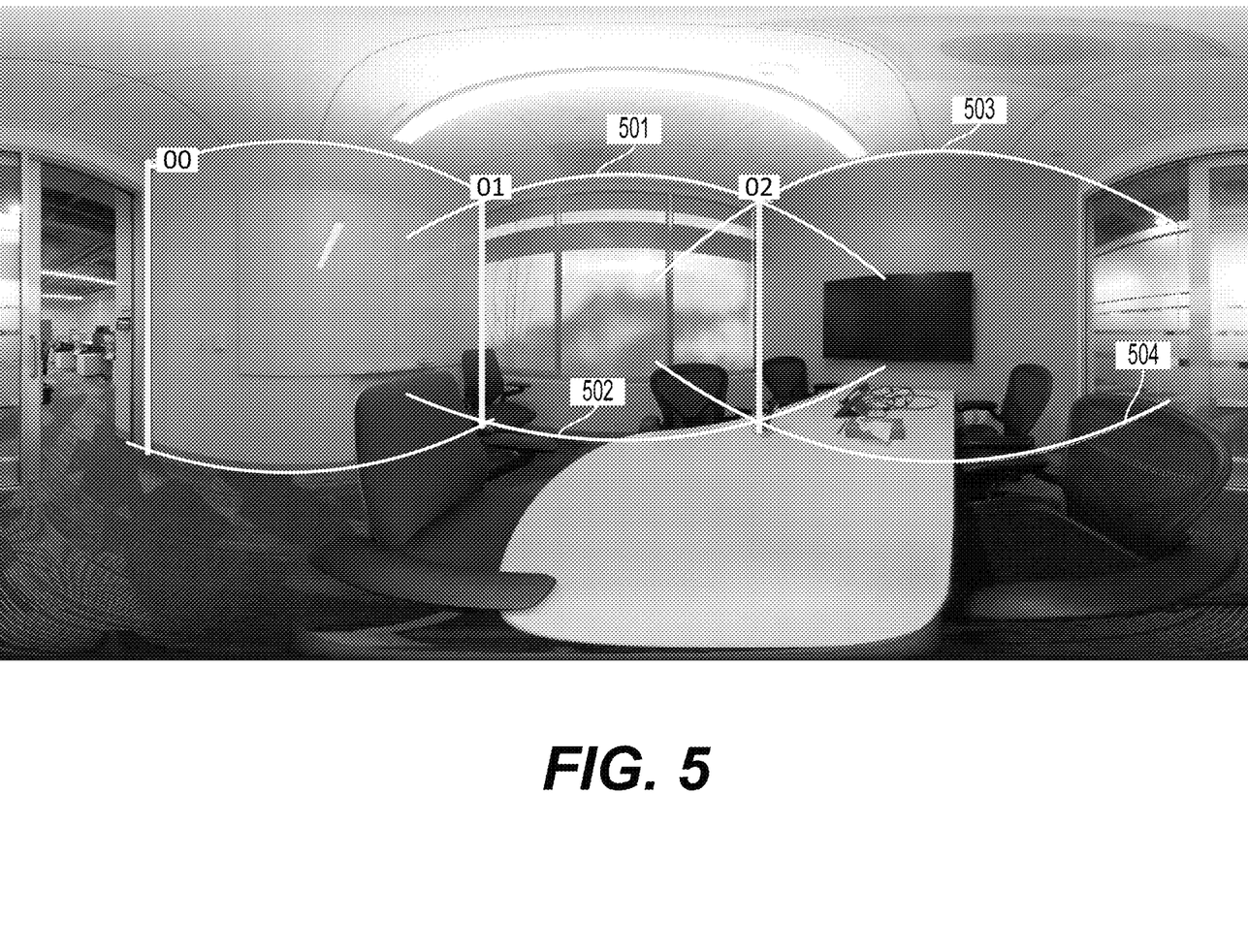
FIG. 5 shows exemplary guide lines used in a marking process according to an embodiment of the disclosure.

In one embodiment, the Manhattan world assumption can be used to guide a marking process of a user. FIG. 5 shows the exemplary display of guide lines that can be used in the marking process according to an embodiment of the disclosure. In FIG. 5, as a solid wall plane is formed after the control points "00" and "01" are marked, a major direction in the Manhattan world can be determined. Then, when a user moves a cursor to find the next control point "02", a set of guide lines can be generated to help the user find it quickly. In FIG. 5, the curves (501)-(504) stretched out from the next control point "02" are preview guide lines. These curves depict two orthogonal wall planes that intersect at the "02" position in the panorama image. Through this way, a degree of convenience and an accuracy of marking the control point "02" can be improved even if the floor and ceiling corner points are both obstructed.

In one embodiment, the Manhattan world assumption can be used to refine a user-marked position. For example, if a user-marked position in the panorama image is close to but not exactly on a guide line, the user-marked position can be slightly adjusted to be consistent with the Manhattan world assumption. Through this way, it is guaranteed that the generated 3D geometry can satisfy the Manhattan world assumption, and thus yielding a more accurate construction.

According to aspects of the disclosure, a 3D geometry (e.g., a point cloud or a textured mesh) can be constructed by marking a set of wall corner points in a ceiling plane and/or a floor plane in a panorama image of a room. The wall corner points can be marked by a user manually in an embodiment. In another embodiment, the wall corner points can be first estimated, such as by an automatic algorithm (e.g., LayoutNet algorithm, HorizonNet algorithm, or DulaNet algorithm), and then modified by a user. In another embodiment, the wall corner points can be first marked by a user and then refined, such as by an automatic algorithm.

In some embodiments, a distance (or a dimension) in the real-world can be measured or estimated based on marked points in the panorama image of the room. The distance in the real-world is from a position in the real-world corresponding to a marked point in the panorama image to a camera device that is configured to capture the image. A 3D coordinate of the position in the real-world can be located in a camera coordinate system in which the camera device can be located at (0, 0, 0) for example.

In one embodiment, an object height (e.g., a vertical distance from the object to a floor plane of the room) can be estimated by marking a point of the object in the panorama image of the room. When the object height is known (or estimated) or otherwise determined, a 3D coordinate of a point in the real-world corresponding to an arbitrary point in the panorama image can be estimated. The 3D coordinate of the position in the real-world can be located in the camera coordinate system in which the camera is located at (0, 0, 0) for example. In addition, when the object height is known (or estimated) or otherwise determined, a distance between two positions in the real-world can be estimated. The two positions can correspond to two arbitrary points in the panorama image of the room.

In some embodiments, a room layout can be defined by a group of marked points (also referred to as control points) in the panorama image. The marked points in a specific order can define a closure that corresponds to the room layout. Two types of marked points can be used, in which a first type of marked points can form a solid wall plane of the room and a second type of marked points can form an opening area of the room.

As noted above, in one embodiment, a computer software (or program) can distinguish the two types of control points by a left click or a right click of a computer mouse. In one embodiment, the computer software (or program) can distinguish the two types of control points with the aid of a keyboard.

For a single panorama image, more than one closure can be used to describe the room layout of the scene. The multiple closures are independent from each other and can have different ceiling heights. Therefore, the multiple closures can be used to represent a scene of multiple rooms with different ceiling heights.

Based on the room layout, a 3D geometry representation of the scene can be constructed. The 3D geometry can be either a point cloud with color and normal vector information, or a mesh with texture information. The color and texture information can be obtained by interpolation from the panorama image.

In some embodiments, certain assumptions such as the Manhattan world assumption can be applied in constructing the 3D geometry of the scene.

In one embodiment, the Manhattan world assumption can be used to guide a marking process. For example, a set of guide lines can be generated in the panorama image based on the Manhattan world assumption. In the marking process, a user can follow the set of guide lines to mark points in the panorama image.

In one embodiment, the Manhattan world assumption can be used to refine a user-marked position. For example, if the user-marked position is not on any of the set of guide lines, the user-marked position can be automatically adjusted to be on one closest guide line.

II. Flowchart

Figure 6:
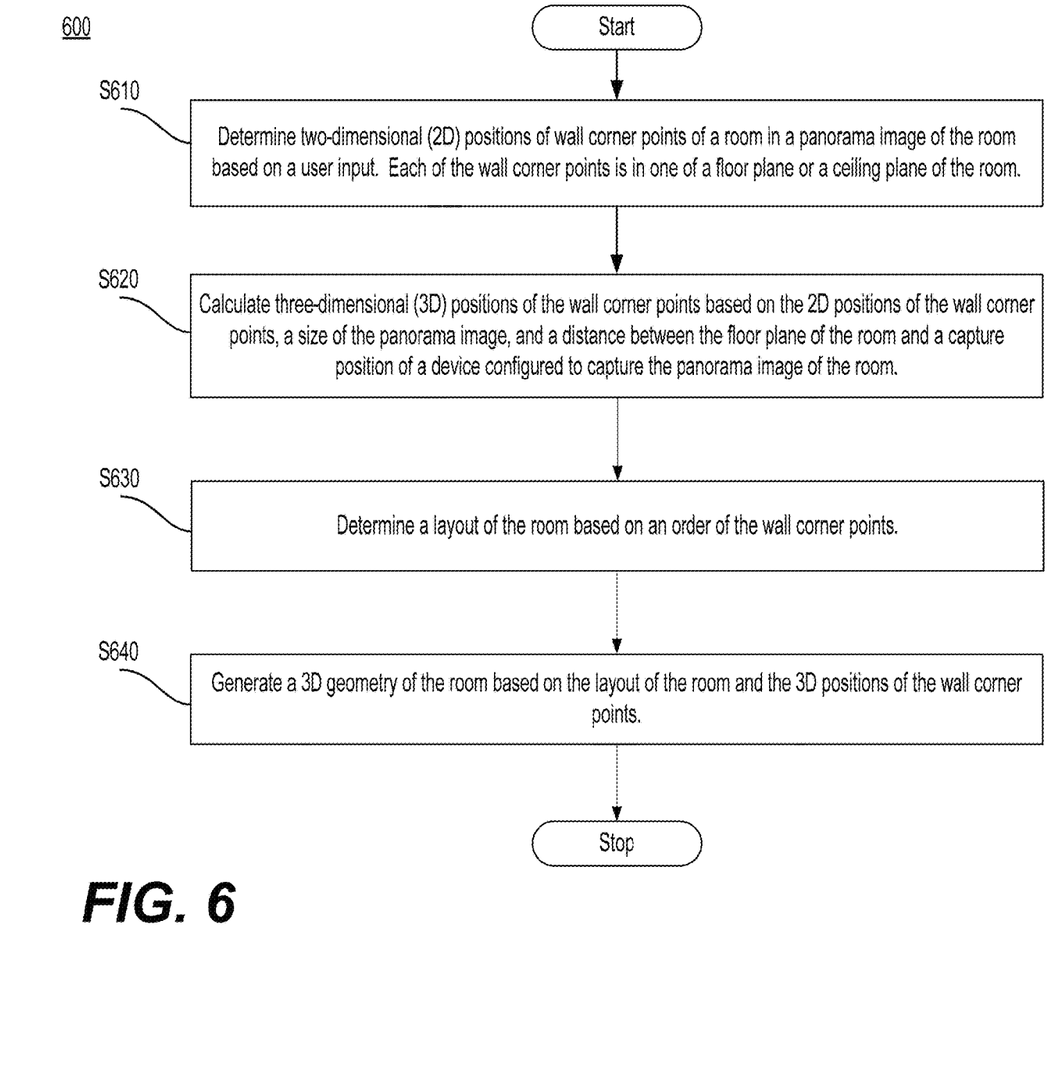
FIG. 6 shows an exemplary flowchart according to an embodiment of the disclosure.

FIG. 6 shows a flow chart outlining an exemplary process (600) according to an embodiment of the disclosure. In various embodiments, the process (600) is executed by processing circuitry, such as the processing circuitry shown in FIG. 7. In some embodiments, the process (600) is implemented in software instructions, thus when the processing circuitry executes the software instructions, the processing circuitry performs the process (600).

The process (600) may generally start at step (S610), where the process (600) determines 2D positions of wall corner points of the room in the panorama image of the room based on a user input. Each of the wall corner points is in one of a floor plane or a ceiling plane of the room. Then, the process (600) proceeds to step (S620).

At step (S620), the process (600) calculates 3D positions of the wall corner points based on the 2D positions of the wall corner points, a size of the panorama image, and a distance between the floor plane of the room and a capture position of a device configured to capture the panorama image of the room. Then, the process (600) proceeds to step (S630).

At step (S630), the process (600) determines a layout of the room based on an order of the wall corner points. Then, the process (600) proceeds to step (S640).

At step (S640), the process (600) generates the 3D geometry of the room based on the layout of the room and the 3D positions of the wall corner points. Then, the process (600) terminates.

In an embodiment, the user input includes a user selection of the wall corner points of the room and the order of the wall corner points.

In an embodiment, at least one of the wall corner points is a first type of wall corner point. The first type of wall corner point indicates a wall plane of the 3D geometry.

In an embodiment, at least one of the wall corner points is a second type of wall corner point. The second type of wall corner point indicates an open area plane of the 3D geometry.

In an embodiment, the processing circuitry generates a plane of the 3D geometry based on a type of a predetermined one of two adjacent wall corner points.

In an embodiment, the process (600) determines, for each 3D position in a plane of the 3D geometry, color information of the respective 3D position based on color information at a 2D position in the panorama image of the room corresponding to the respective 3D position.

In an embodiment, each wall plane of the 3D geometry is parallel or orthogonal to at least one other wall plane of the 3D geometry, and the process (600) generates a guide line that assists a user to select one of the wall corner points.

In an embodiment, each wall plane of the 3D geometry is parallel or orthogonal to at least one other wall plane of the 3D geometry, and the process (600) adjusts one of the wall corner points that is selected by the user.

In an embodiment, the process (600) determines 2D positions of two points in the panorama image of the room. The process (600) calculates 3D positions of the two points based on the 2D positions of the two points, the size of the panorama image, and the distance between the floor plane of the room and the capture position of the device. The process (600) calculates a distance between the 3D positions of the two points.

III. Computer System

The techniques described above, can be implemented as computer software using computer-readable instructions and physically stored in one or more computer-readable media. For example, FIG. 7 shows a computer system (700) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 7:
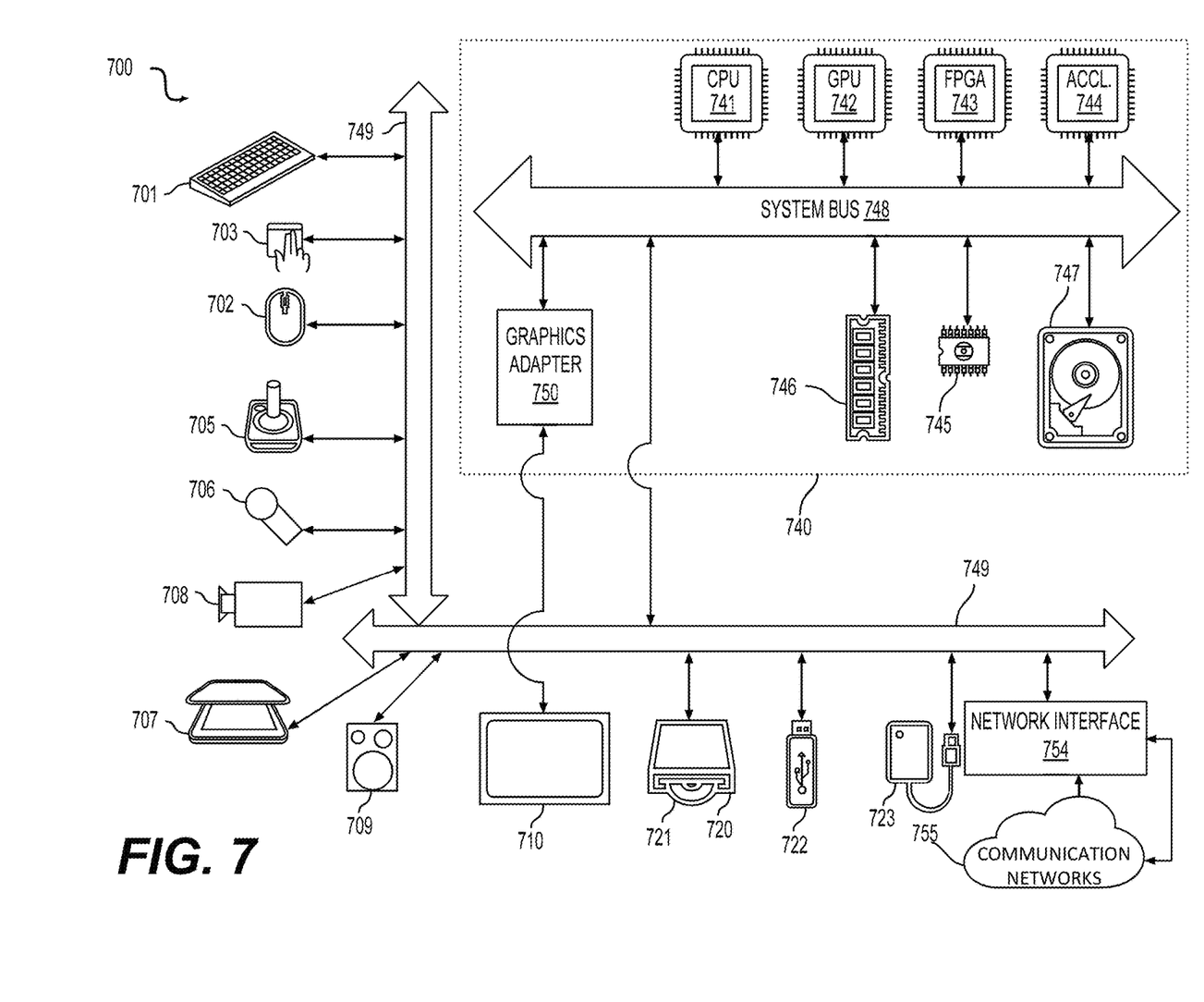
FIG. 7 is a schematic illustration of a computer system according to an embodiment of the disclosure.

The components shown in FIG. 7 for computer system (700) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (700).

Computer system (700) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (701), mouse (702), trackpad (703), touch screen (710), data-glove (not shown), joystick (705), microphone (706), scanner (707), and camera (708).

Computer system (700) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (710), data-glove (not shown), or joystick (705), but there can also be tactile feedback devices that do not serve as input devices), audio output devices (such as: speakers (709), headphones (not depicted)), visual output devices (such as screens (710) to include CRT screens, LCD screens, plasma screens, OLED screens, each with or without touch-screen input capability, each with or without tactile feedback capability-some of which may be capable to output two dimensional visual output or more than three dimensional output through means such as stereographic output; virtual-reality glasses (not depicted), holographic displays and smoke tanks (not depicted)), and printers (not depicted). These visual output devices (such as screens (710)) can be connected to a system bus (748) through a graphics adapter (750).

Computer system (700) can also include human accessible storage devices and their associated media such as optical media including CD/DVD ROM/RW (720) with CD/DVD or the like media (721), thumb-drive (722), removable hard drive or solid state drive (723), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (700) can also include a network interface (754) to one or more communication networks (755). The one or more communication networks (755) can for example be wireless, wireline, optical. The one or more communication networks (755) can further be local, wide-area, metropolitan, vehicular and industrial, real-time, delay-tolerant, and so on. Examples of the one or more communication networks (755) include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (749) (such as, for example USB ports of the computer system (700)); others are commonly integrated into the core of the computer system (700) by attachment to a system bus as described below (for example Ethernet interface into a PC computer system or cellular network interface into a smartphone computer system). Using any of these networks, computer system (700) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (740) of the computer system (700).

The core (740) can include one or more Central Processing Units (CPU) (741), Graphics Processing Units (GPU) (742), specialized programmable processing units in the form of Field Programmable Gate Areas (FPGA) (743), hardware accelerators for certain tasks (744), graphics adapters (750), and so forth. These devices, along with Read-only memory (ROM) (745), Random-access memory (746), internal mass storage (747) such as internal non-user accessible hard drives, SSDs, and the like, may be connected through the system bus (748). In some computer systems, the system bus (748) can be accessible in the form of one or more physical plugs to enable extensions by additional CPUs, GPU, and the like. The peripheral devices can be attached either directly to the core's system bus (748), or through a peripheral bus (749). In an example, the screen (710) can be connected to the graphics adapter (750). Architectures for a peripheral bus include PCI, USB, and the like.

CPUs (741), GPUs (742), FPGAs (743), and accelerators (744) can execute certain instructions that, in combination, can make up the aforementioned computer code. That computer code can be stored in ROM (745) or RAM (746). Transitional data can be also be stored in RAM (746), whereas permanent data can be stored for example, in the internal mass storage (747). Fast storage and retrieve to any of the memory devices can be enabled through the use of cache memory, that can be closely associated with one or more CPU (741), GPU (742), mass storage (747), ROM (745), RAM (746), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (700) and specifically the core (740) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (740) that are of non-transitory nature, such as core-internal mass storage (747) or ROM (745). The software implementing various embodiments of the present disclosure can be stored in such devices and executed by core (740). A computer-readable medium can include one or more memory devices or chips, according to particular needs. The software can cause the core (740) and specifically the processors therein (including CPU, GPU, FPGA, and the like) to execute particular processes or particular parts of particular processes described herein, including defining data structures stored in RAM (746) and modifying such data structures according to the processes defined by the software. In addition or as an alternative, the computer system can provide functionality as a result of logic hardwired or otherwise embodied in a circuit (for example: accelerator (744)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method of generating a three-dimensional (3D) representation of a room from a panorama image of the room, the method comprising:
    determining two-dimensional (2D) positions of wall corner points of the room in the panorama image of the room based on a user selection of the wall corner points captured in the panorama image, each of the wall corner points being in one of a floor plane or a ceiling plane of the room;
    calculating 3D positions of the wall corner points based on the 2D positions of the wall corner points, a size of the panorama image, and a distance between the floor plane of the room and a capture position of a device configured to capture the panorama image of the room;
    determining a layout of the room based on an order of the wall corner points; and
    generating the 3D representation of the room based on the layout of the room and the 3D positions of the wall corner points.

2. The method of claim 1, wherein the determining the 2D positions of the wall corner points comprises:
    determining the 2D positions of the wall corner points of the room in the panorama image of the room based on an order in which the wall corner points are selected.

3. The method of claim 1, wherein at least one of the wall corner points is a first type of wall corner point, the first type of wall corner point indicating a wall plane of the 3D representation.

4. The method of claim 1, wherein at least one of the wall corner points is a second type of wall corner point, the second type of wall corner point indicating an open area plane of the 3D representation.

5. The method of claim 1, wherein the generating comprises:
    generating a plane of the 3D representation based on a type of a predetermined one of two adjacent wall corner points.

6. The method of claim 1, further comprising:
    determining, for each 3D position in a plane of the 3D representation, color information of the respective 3D position based on color information at a 2D position in the panorama image of the room corresponding to the respective 3D position.

7. The method of claim 1, wherein
    each wall plane of the 3D representation is parallel or orthogonal to at least one other wall plane of the 3D representation, and
    the method further includes generating a guide line that assists a user to select one of the wall corner points.

8. The method of claim 1, wherein
    each wall plane of the 3D representation is parallel or orthogonal to at least one other wall plane of the 3D representation, and
    the method further includes adjusting one of the wall corner points that is selected by the user.

9. The method of claim 1, further comprising:
    determining 2D positions of two points in the panorama image of the room;
    calculating 3D positions of the two points based on the 2D positions of the two points, the size of the panorama image, and the distance between the floor plane of the room and the capture position of the device; and
    calculating a distance between the 3D positions of the two points.

10. An apparatus, comprising:
    processing circuitry configured to:
        determine two-dimensional (2D) positions of wall corner points of a room in a panorama image of the room based on a user selection of the wall corner points captured in the panorama image, each of the wall corner points being in one of a floor plane or a ceiling plane of the room;
        calculate three-dimensional (3D) positions of the wall corner points based on the 2D positions of the wall corner points, a size of the panorama image, and a distance between the floor plane of the room and a capture position of a device configured to capture the panorama image of the room;
        determine a layout of the room based on an order of the wall corner points; and
        generate a 3D representation of the room based on the layout of the room and the 3D positions of the wall corner points.

11. The apparatus of claim 10, wherein the processing circuitry is configured to:
    determine the 2D positions of the wall corner points of the room in the panorama image of the room based on an order in which the wall corner points are selected.

12. The apparatus of claim 10, wherein at least one of the wall corner points is a first type of wall corner point, the first type of wall corner point indicating a wall plane of the 3D representation.

13. The apparatus of claim 10, wherein at least one of the wall corner points is a second type of wall corner point, the second type of wall corner point indicating an open area plane of the 3D representation.

14. The apparatus of claim 10, wherein the processing circuitry is further configured to:
generate a plane of the 3D representation based on a type of a predetermined one of two adjacent wall corner points.

15. The apparatus of claim 10, wherein the processing circuitry is further configured to:
determine, for each 3D position in a plane of the 3D representation, color information of the respective 3D position based on color information at a 2D position in the panorama image of the room corresponding to the respective 3D position.

16. The apparatus of claim 10, wherein
each wall plane of the 3D representation is parallel or orthogonal to at least one other wall plane of the 3D representation, and
the processing circuitry is further configured to:
generate a guide line that assists a user to select one of the wall corner points.

17. The apparatus of claim 10, wherein
each wall plane of the 3D representation is parallel or orthogonal to at least one other wall plane of the 3D representation, and
the processing circuitry is further configured to:
adjust one of the wall corner points that is selected by the user.

18. The apparatus of claim 10, wherein the processing circuitry is further configured to:
determine 2D positions of two points in the panorama image of the room;
calculate 3D positions of the two points based on the 2D positions of the two points, the size of the panorama image, and the distance between the floor plane of the room and the capture position of the device; and
calculate a distance between the 3D positions of the two points.

19. A non-transitory computer-readable storage medium storing instructions which, when executed by at least one processor, cause the at least one processor to perform:
determining two-dimensional (2D) positions of wall corner points of a room in a panorama image of the room based on a user selection of the wall corner points captured in the panorama image, each of the wall corner points being in one of a floor plane or a ceiling plane of the room;
calculating three-dimensional (3D) positions of the wall corner points based on the 2D positions of the wall corner points, a size of the panorama image, and a distance between the floor plane of the room and a capture position of a device configured to capture the panorama image of the room;
determining a layout of the room based on an order of the wall corner points; and
generating a 3D representation of the room based on the layout of the room and the 3D positions of the wall corner points.

20. The non-transitory computer-readable storage medium of claim 19, wherein the determining the 2D positions of the wall corner points comprises:
determining the 2D positions of the wall corner points of the room in the panorama image of the room based on an order in which the wall corner points are selected.

* * * * *